US 6,610,582 B1

(12) United States Patent
Stewart

(10) Patent No.: US 6,610,582 B1
(45) Date of Patent: Aug. 26, 2003

(54) FIELD-ASSISTED FUSION BONDING

(75) Inventor: Robert E. Stewart, Woodland Hills, CA (US)

(73) Assignee: Northrop Grumman Corporation, Woodland Hills, CA (US)

( * ) Notice: Subject to any disclaimer, the term of this patent is extended or adjusted under 35 U.S.C. 154(b) by 0 days.

(21) Appl. No.: 10/106,156

(22) Filed: Mar. 26, 2002

(51) Int. Cl.[7] .................. H01L 21/30; H01L 21/46; H01L 21/326; H01L 21/479
(52) U.S. Cl. .................. 438/455; 438/466; 438/470
(58) Field of Search .................. 438/455, 466, 438/470, 406

(56) References Cited

U.S. PATENT DOCUMENTS

| 5,236,118 A | * | 8/1993 | Bower et al. | ............ 228/193 |
|---|---|---|---|---|
| 6,008,113 A | * | 12/1999 | Ismail et al. | ............ 438/615 |
| 6,118,181 A | * | 9/2000 | Merchant et al. | ........... 257/757 |
| 6,143,628 A | * | 11/2000 | Sato et al. | ............ 438/455 |
| 6,159,824 A | * | 12/2000 | Henley et al. | ............ 438/455 |
| 2002/0048900 A1 | * | 4/2002 | Lo et al. | ............ 438/455 |

* cited by examiner

*Primary Examiner*—Alexander Ghyka
(74) *Attorney, Agent, or Firm*—Patti & Brill, LLC

(57) ABSTRACT

A method of field-assisted fusion bonding produces multiple-layer devices. Contacts (301, 303, 305, 307, 309) are placed at various points along different surfaces of a combination of two or more wafers (201, 203, 205, 501, 503, 505, 801, 803). An electric field is applied to the contacts (301, 303, 305, 307, 309), thereby creating an electrostatic attractive force between the wafers (201, 203, 205, 501, 503, 505, 801, 803). The temperature of the wafer combination is elevated to a fusion bonding temperature while the electric field is applied.

18 Claims, 5 Drawing Sheets

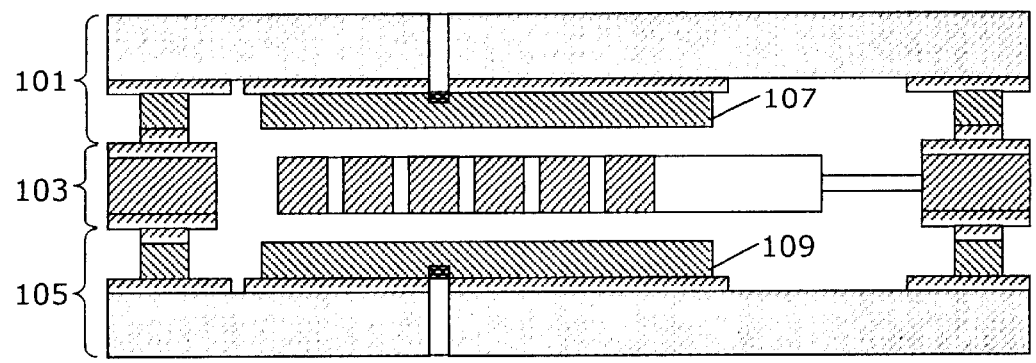
FIG. 1  --PRIOR ART--
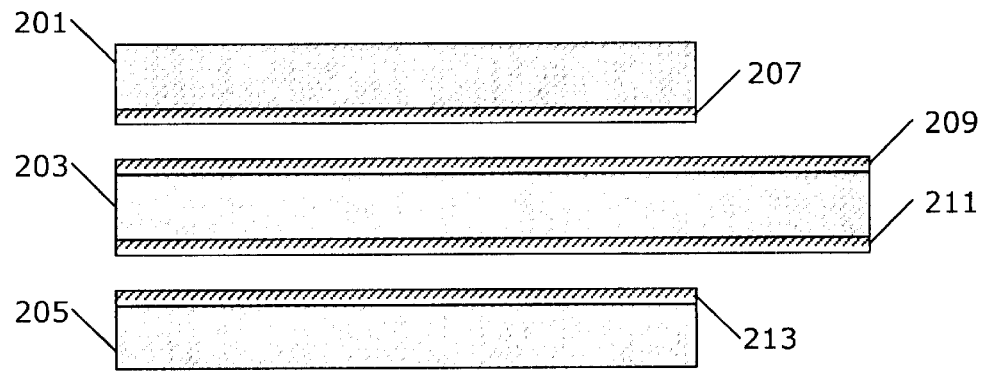
FIG. 2
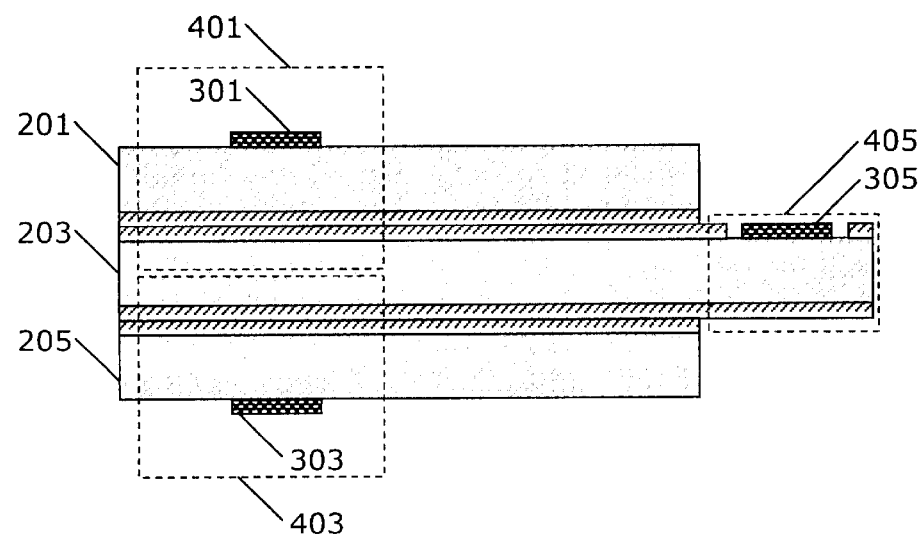
FIG. 3

FIELD-ASSISTED FUSION BONDING

FIELD OF THE INVENTION

This invention relates to semiconductor bonding, including but not limited to fusion bonding of two or more semiconductor wafers.

BACKGROUND

Semiconductors, such as silicon, germanium, or gallium arsenide, are utilized to build components such as Micro Electromechanical Systems (MEMS), also known as Microsystems Technology (MST), that provide various different functions in numerous different devices. For example, MEMS may be used in inkjet printers, pressure sensors, crash sensors in vehicles, accelerometers, gyros, inertial instruments, and so forth. An example of such a device is shown in FIG. 1. In this instance, two silicon-on-insulator (SOI) wafers 101 and 105 surround a center wafer 103 The device layers on each of these SOI wafers are etched to provide the appropriate function desired for the component. Two different ways of bonding semiconductor wafers are predominantly utilized: fusion bonding and anodic bonding.

Fusion bonding is performed by hydrolyzing the surfaces of the wafers, aligning the wafers relative to each other as necessary, and contacting the wafers together. The wafers are then brought to a fusion bonding temperature, typically between 300° C. and 800° C., and subsequently annealed at a higher temperature such as 800° C. to 1100° C. to increase the bond strength.

Anodic bonding is a process that joins together a silicon wafer and a sodium-containing glass substrate having similar coefficients of thermal expansion. Bonding is performed at a temperature between 200° C. and 500° C. while a voltage (500 to 1500 V DC) is applied across the substrates. The glass substrate is held at a negative potential, causing positive sodium ions to be mobile in the heated glass and to migrate away from the silicon-glass interface toward the cathode, leaving behind negative fixed charges. Bonding is complete when the ion current vanishes, indicating that a layer depleted of mobile sodium ions have been produced and non-bridging oxygen atoms have attached to silicon atoms to form silicon dioxide bonds. Anodic bonding is also known as electrostatic bonding.

Because the co-efficient of thermal expansion between glass and silicon in anodic bonding is not identical, thermal stresses may result in the manufacture of a MEMS device that experiences impaired performance over temperature. Depending on cleanliness and contact conditions, the fusion bonding process may cause trapped contaminants and gas pockets that result in poorly bonded areas, i.e., the bond strengths vary across the wafer. Although fusion bonding is often utilized to manufacture silicon MEMS, such devices may not have consistent bond strengths through the wafer due to the discontinuous bond areas caused by etching of the desired devices. Therefore, an improved method of wafer bonding for a MEMS devices and SOI wafer production is desired.

Accordingly, there is a need for a method of wafer bonding that provides a strong bond with minimal thermal stresses.

SUMMARY

A method of producing a device comprises the steps of elevating a plurality of wafers to a fusion bonding temperature and applying a voltage between at least one electrical contact on at least one surface of a first wafer of the plurality of wafers and at least one electrical contact on at least one surface of a second wafer of the plurality of wafers.

DESCRIPTION OF THE DRAWINGS

FIG. 1 is a cross-sectional side view of a MEMS structure.

FIG. 2 is a cross-sectional side view of three wafers in accordance with the invention.

FIG. 3 is a cross-sectional side view of three wafers having electrical contacts in accordance with the invention.

DETAILED DESCRIPTION

Figure 4:
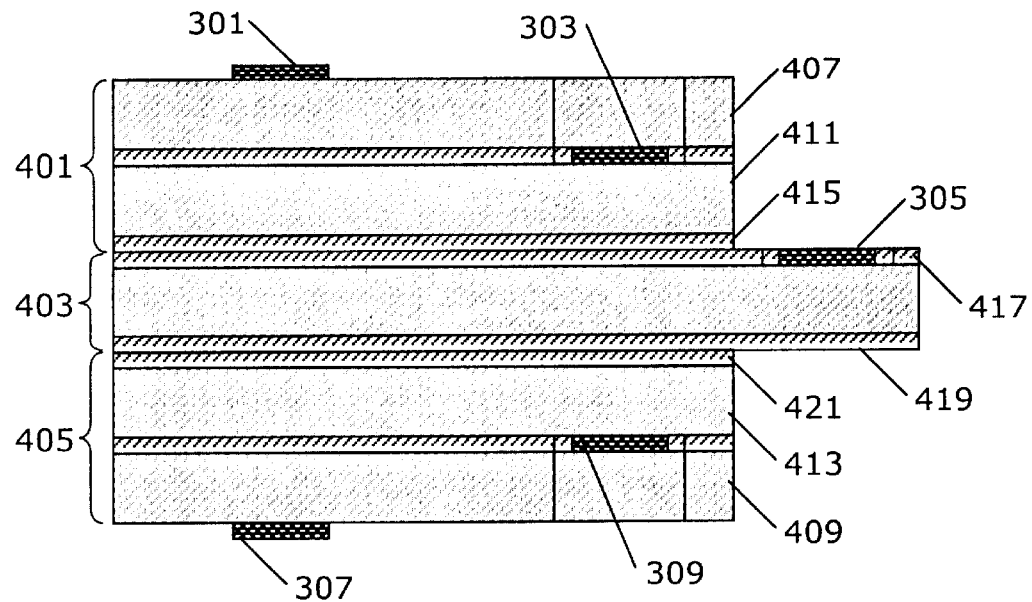
FIG. 4 is a top view of a wafer structure showing electrical contacts in accordance with the invention.

The following describes an apparatus for and method of field-assisted fusion bonding. Contacts are placed at various points along different surfaces of a combination of two or more wafers. An electric field is applied to the contacts, thereby creating an electrostatic attractive force between the wafers. The temperature of the wafer combination is elevated to a fusion bonding temperature while the electric field is applied.

The cross-sectional side view in FIG. 2 shows three wafers 201, 203, and 205 that are intended to be bonded together. Application of the present invention to various examples of different combinations of wafers will be shown. Note that the figures are not drawn to scale.

An oxide layer 207, 209, 211, and 213, such as silicon dioxide $SiO_2$ for silicon wafers or other oxides as appropriate to the wafer composition, is grown on each of the surfaces that will be in contact between the wafers 201, 203, and 205. Oxide layers 207, 209, 211, and 213 are grown on the surfaces to a depth of approximately 1 to 2 microns. The surfaces with grown oxide layers are hydrolyzed as known in the art.

The wafers are aligned and contacted, in any of many ways known in the art, as shown in FIG. 3. Contacts 301, 303, and 305 are in one example deposited on the outer surfaces of the composite structure. The contacts 301, 303, and 305 are in another example placed or disposed on the outer surfaces of the composite structure. Two of the contacts 301 and 303 are formed on the outer surfaces on the composite structure. Generally, the contacts are metallized and are formed by depositing aluminum or other suitable material(s) in a manner known in the art, such as vacuum deposition through a mask and annealing until the material makes ohmic contact with the adjacent layer. Each of the contacts 301, 303, and 305 are shown in their respective cross-sectional areas 401, 403, and 405, as are shown in FIG. 4.

Contacts 301, 303, 305, 307, and 309 that may utilized in field-assisted fusion bonding are shown in FIG. 4, which shows a top view of a composite wafer structure. One contact is utilized per non-oxide (e.g., silicon or glass) layer.

For the example of FIG. 3, contacts 301, 303, and 305 are utilized. For the example in FIG. 5 that shows a MEMS structure, three contacts 305, 307, and 309 are utilized. One contact 307 is disposed on the upper wafer 501 on the device layer 511. A contact 305 is placed in the middle wafer 503. The last contact is placed on the lower wafer 505 on the device layer 513. For the example in FIG. 8 that shows a five-wafer structure, all five contacts 301, 303, 305, 307, and 309 are utilized. One contact 301 is disposed on the upper wafer 801, one contact 307 is dispose on the wafer 803 below, and another contact 305 is disposed on the middle wafer 805. A contact 303 is disposed on the lowest wafer 809, and another contact 309 is disposed on the wafer 807 above. The two-wafer example of FIG. 9 utilizes only two contacts 301 and 303 disposed on the outer parts of the wafers. The number and placement of contacts is shown for illustrative purposes. Additional contacts and/or other placement of the contacts may be utilized.

Figure 5:
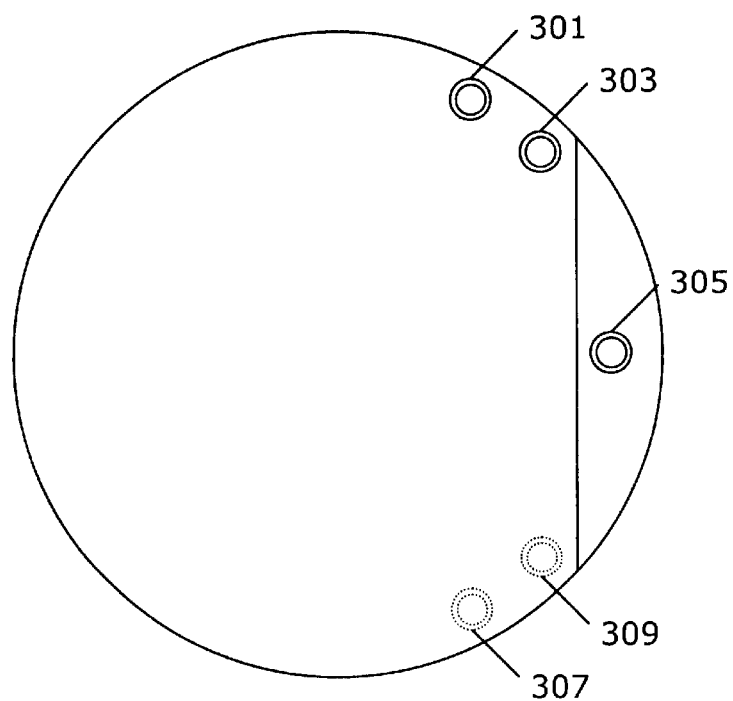
FIG. 5 is a multiple-cross-sectional side view of a MEMS structure having electrical contacts in accordance with the invention.

A multiple-cross-sectional side view of a MEMS structure having electrical contacts is shown in FIG. 5. In this example, two SOI wafers 501 and 505 have oxide layers 515 and 521 grown on their device layers 511 and 513, respectively. The center layer 503, which is a single layer wafer, has oxide layers 517 and 519 grown on each of its outer surfaces. A contact 305 is deposited in a cutout in the oxide layer 517 of the single layer wafer 503. Two contacts 307 and 309 are placed in holes etched in the handle layers 507 and 509, respectively, which holes are etched through the oxide layer to the device layers 511 and 513 of the SOI wafers 501 and 505, respectively. Each of the contacts 305, 307, and 309 are shown in their respective cross-sectional areas 405, 407, and 409, as are shown in FIG. 4. The contacts 305, 307, and 309 are preferably thinner than the nearby oxide layers, for example, to prevent electrical contact to the handle layer.

Figure 6:
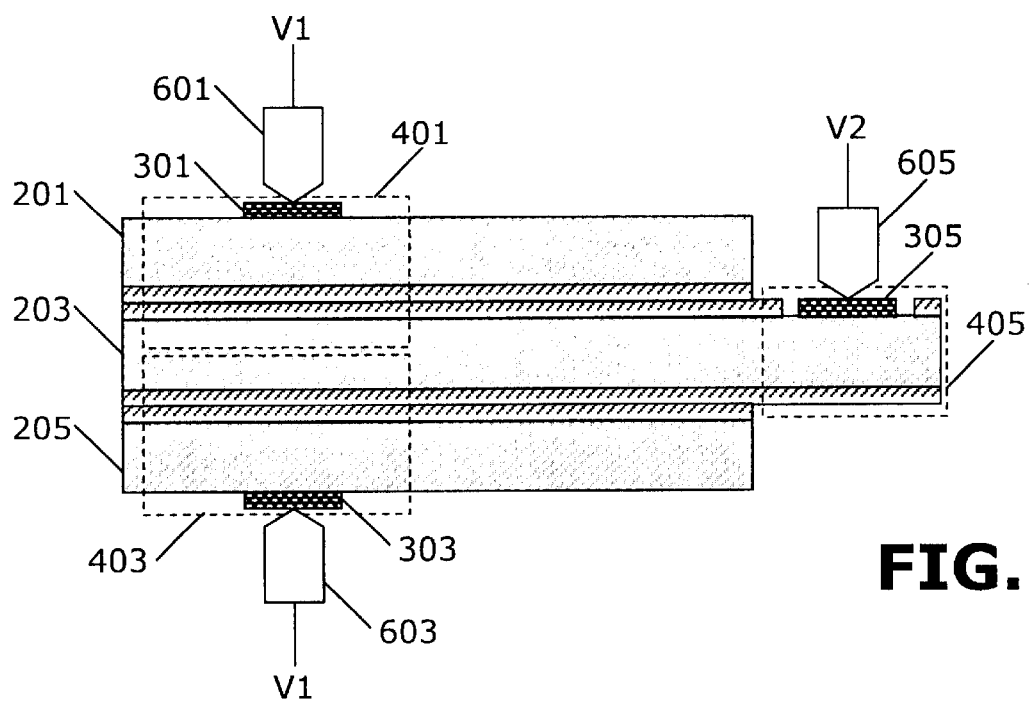
FIG. 6 is a multiple-cross-sectional side view of a three-wafer structure with an applied electrical field in accordance with the invention.

A multiple-cross-sectional side view of a three-wafer structure with an applied electrical field is shown in FIG. 6, which shows the structure of FIG. 3 with probes and appropriate voltages applied to the probes. As shown in FIG. 6, probes 601, 603, and 605 are connected to the contacts 301, 303, and 305, respectively, that are disposed on the various surfaces of these wafers. A first voltage potential is applied to the probes 601 and 603 that are on the externalmost surfaces of the composite wafer structure The remaining probe 605 is at a second voltage potential. The application of voltage across the device causes a electric field to form across the oxide layers of the wafers, thereby increasing the force of attraction between the layers, resulting in an improved bond.

Figure 7:
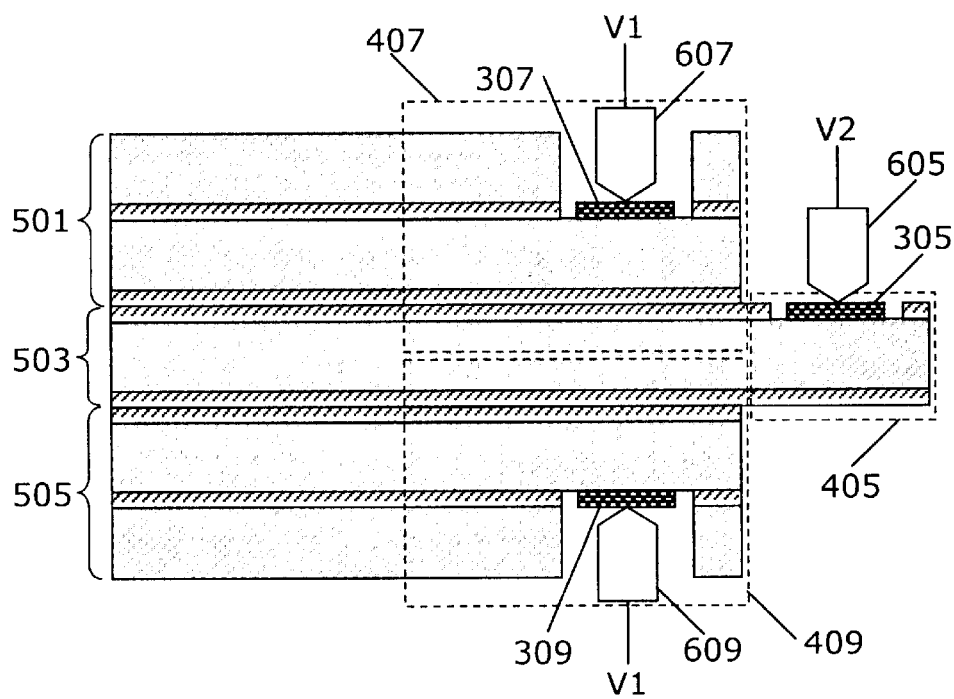
FIG. 7 is a multiple-cross-sectional side view of a MEMS structure with an applied electrical field in accordance-with the invention.

A multiple-cross-sectional side view of a MEMS structure with an applied electrical field is shown in FIG. 7, which shows the structure of FIG. 5 with probes and appropriate voltages applied to the probes.

Figure 8:
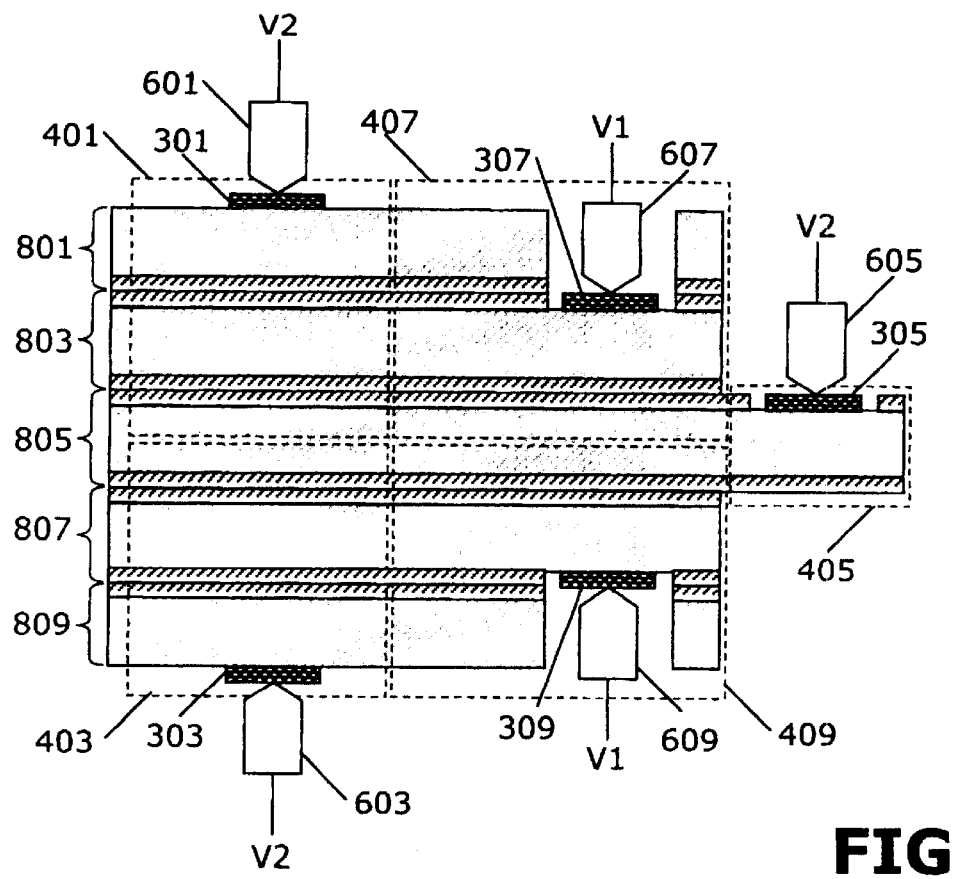
FIG. 8 is a multiple-cross-sectional side view of a multiple-wafer structure with an applied electrical field in accordance with the invention.

A multiple-cross-sectional side view of a multiple-wafer structure with an applied electrical field is shown in FIG. 8. In this example, five wafers 801, 803, 805, 807, and 809 are shown with five probes 601, 603, 605, 607, and 609 applied, one to each layer. In one example, a first voltage potential is applied to two of the probes 607 and 609, and a second voltage potential is applied to the remaining probes 601, 603, and 605. In another example, the first voltage potential is applied to the probes 607 and 609, and the second voltage potential is applied to the probes 601, 603, and 605.

The first voltage potential may be, for example, between −300 and −1000 volts DC, between +300 and +1000 volts DC, or any other suitable voltage. The second voltage potential may be, for example, ground potential. The voltage may be a constant voltage or a pulsed voltage. Alternatively, a voltage differential may be set up between the probes, wherein one or more probes are at, for example 500 V and the remaining probe(s) is (are) at 200 V, creating a 300 V voltage differential. If desired, three or more voltage potentials may be utilized.

Although the drawings show an oxide layer on each wafer surface that contacts another wafer surface, an oxide layer may be grown on only one of the surfaces, and the oxide layer on the other surface may be the native oxide layer that naturally forms on a wafer surface. Alternatively, the oxide layer may be grown on both surfaces. Thus, the relative size of the oxide layers may not be necessarily proportional to the scale shown in the drawings.

Figure 9:
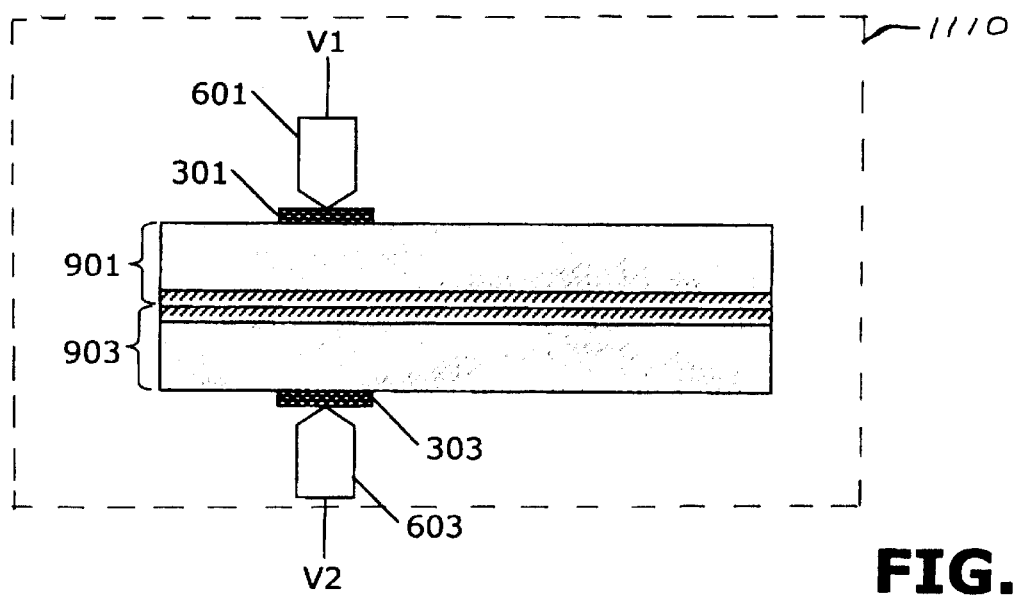
FIG. 9 is a multiple-cross-sectional side view of a two-wafer structure with an applied electrical field in accordance with the invention.

FIG. 9 shows an example of an electric field (voltage) application for a two-layer structure. The device shown in FIG. 9 may be, for example, an SOI wafer during the bonding process. A voltage is applied to the probe 601 that is contacted with the contact 301 on the outer surface of the top wafer 901, and a ground potential is applied to the probe 603 that is contacted with the contact 303 on the outer surface of the other wafer 903. Using the methods shown herein, wafers having any number of layers may be bonded using the field-assisted fusion bonding method described herein.

Figure 10:
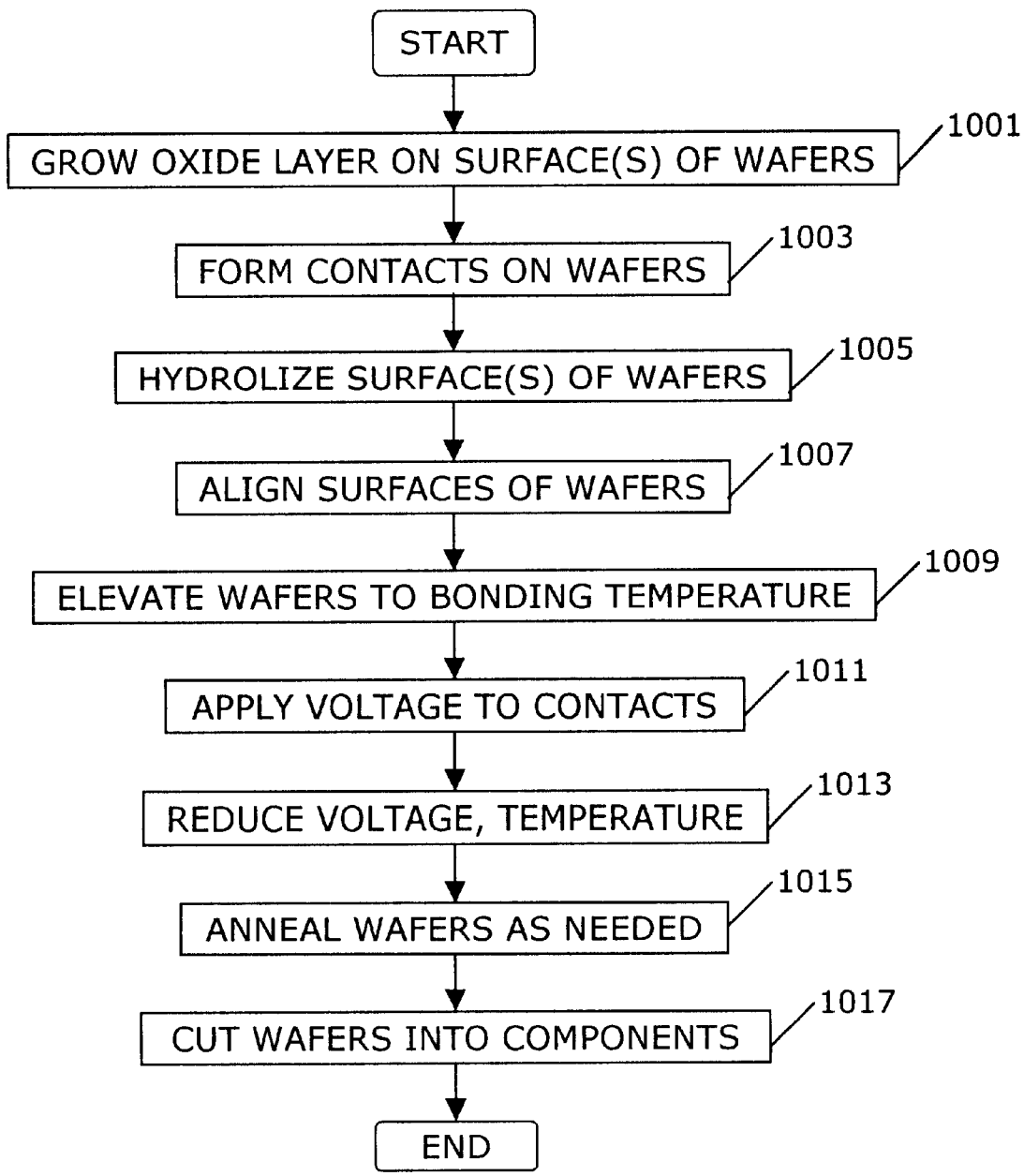
FIG. 10 is flowchart showing a method of field-assisted fusion bonding in accordance with the invention.

A flowchart showing a method of field-assisted fusion bonding is shown in FIG. 10. At step 1001, an oxide layer 207, 209, 211, 213, 515, 517, 519, 521 is grown on the appropriate surfaces of the wafers to be joined. At step 1003, contacts 301, 303, 305, 307, and 309 are disposed, placed, deposited, or formed in the appropriate places on the wafers. The oxide layers' surfaces are hydrolyzed at step 1005, as known in the art. The contact forming/placing step may be performed at any time prior to step 1009. At step 1007, the surfaces of the wafers are aligned in order to properly form the devices that are intended to be formed, and the wafers are contacted together. The aligning step may take place any time prior to step 1009.

At step 1009, the wafers are elevated to (fusion) bonding temperature. Fusion bonding temperature may be between 300° and 800° C., or any other temperature suitable to fusion bonding. Those skilled in the art are familiar with heaters that are used to elevate wafers to a (fusion) bonding temperature. Such a heater is depicted at 1110 in FIG. 9. A representative heater is Model EVG501 sols by The EV Group. The disclosure of Model EVG501 is shown and described at www.evgroup.com, the disclosure of which is hereby incorporated by reference. At step 1011, the appropriate voltage is applied to the contacts as described above. Device layer features (such as those 107 and 109 shown in FIG. 1) in the device layers of the SOI wafers are electrically isolated from the areas to be bonded. The features 107 and 109 in FIG. 1 preferably do not have oxide layers and may be attached to the same electric potential as the center layer to prevent bonding to the sensing element.

At step 1013, the voltage and temperature are reduced. At step 1015, the wafers may be annealed at a temperature of approximately 1100° C. Because field-assisted fusion bonding provides an improved bond to prior fusion bonding processes, the annealing step may not be necessary. By reducing the need to anneal the wafers, the need to increase the temperature to such a high temperature may not be necessary, and may prevent the harmful destruction of other devices that may be formed on the structure, such as metal electrodes, integrated circuits, or other temperature sensitive pieces. These pieces may be placed prior to the fusion process when annealing does not take place. At step 1017, the wafers are cut into separate die or components as desired.

The wafers in the figures may be single-layer silicon wafers, multiple-layer silicon wafers such as SOI wafers, glass substrates or wafers, such as Pyrex® glass that contains sodium, or a combination of various types of wafers.

Thus, all of the wafers in a device may be comprised of the same material(s) or a combination of materials, such as silicon, other semiconductors, and/or glass. The wafers may be etched to define the functions of the wafer die, as known in the art. The process of the present invention may be applied to any number of layers or wafers. For example, fusion bonding may be combined with anodic bonding, and the example of FIG. 5 would contain layers 507 and 509 that may be glass layers and the remaining layers 511, 503, and 513 may be silicon layers.

Field-assisted fusion bonding provides an improved bond over non-field-assisted fusion bonding that may be accomplished at low temperatures. Likewise, the present invention makes possible fusion-assisted anodic bonding by utilizing similar principles. The present invention provides an improved method of wafer bonding for MEMS devices and SOI wafer production. Wafer bonding in accordance with the present invention provides a strong bond with minimal thermal stresses. A bond may be formed in low temperature (e.g., <500° C.) when thin film metal is deposited prior to wafer bonding. A low temperature fusion bonding method is provided for compatibility with integrated circuit processing. Improved bonding, as provided by the present invention, results in cost savings, in addition to other advantages.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A method comprising the steps of:
   hydrolyzing a first surface of a first wafer;
   aligning the first wafer and a second wafer such that the hydrolyzed first surface of the first wafer and a first surface of the second wafer are touching;
   elevating the first wafer and the second wafer to a fusion bonding temperature; and
   applying an electric field to the wafers to create an attractive force between the wafers.

2. The method of claim 1, wherein the step of applying includes the step of applying a voltage between at least one electrical contact on a second surface of the first wafer and at least one electrical contact on a second surface of the second wafer.

3. The method of claim 2, further comprising the step of, prior to the hydrolyzing step, growing an oxide layer on at least one of the first surface of the first wafer and the first surface of the second wafer.

4. The method of claim 3, wherein any oxide layer comprises discontinuous oxide that forms a framework of oxide, and the step of aligning comprises matching the framework of each oxide layer.

5. The method of claim 2, further comprising the step of, after the applying step reducing the temperature and the voltage.

6. The method of claim 2, further comprising the steps of, prior to the aligning step:
   hydrolyzing a first surface and a second surface of a third wafer;
   inserting the third wafer between the hydrolyzed first surface of the first wafer and the hydrolyzed first surface of the second wafer;
   aligning the first wafer, the second wafer, and the third wafer such that the hydrolyzed first surface of the first wafer and the hydrolyzed first surface of the third wafer are touching and the hydrolyzed first surface of the second wafer and the hydrolyzed second surface of the third wafer are touching.

7. The method of claim 4, further comprising the step of, prior to the hydrolyzing step, growing an oxide layer on at least one of the first surface of the third wafer and the second surface of the third wafer.

8. The method of claim 7, wherein any oxide layer comprises discontinuous oxide that forms a framework of oxide, and the step of aligning comprises matching the framework of each oxide layer.

9. The method of claim 6, wherein the first wafer and the second wafer are silicon-on-insulator wafers.

10. The method of claim 6, wherein the first wafer and the second wafer are glass wafers, and the third wafer is a silicon wafer.

11. The method of claim 2, further comprising the step of annealing the wafers.

12. A method comprising the steps of:
    hydrolyzing a first surface of a first wafer, a first surface of a second wafer, and a first surface and a second surface of at least another wafer;
    aligning the first wafer, the second wafer, and the at least another wafer such that the hydrolyzed first surface of the first wafer and the hydrolyzed first surface of the at least another wafer are touching and the hydrolyzed first surface of the second wafer and the hydrolyzed second surface of the at least another wafer are touching;
    elevating the first wafer, the second wafer, and the at least another wafer to a fusion bonding temperature;
    applying a first voltage to at least one electrical contact on a second surface of the first wafer and to at least one electrical contact on a second surface of the second wafer, while applying a second voltage to at least one electrical contact on the at least another wafer.

13. The method of claim 12, further comprising the steps of, prior to the aligning step:
    growing an oxide layer on at least one of the first surface of the first wafer and the first surface of the at least another wafer;
    growing an oxide layer on at least one of the first surface of the second wafer and the second surface of the at least another wafer.

14. The method of claim 13, wherein any oxide layer comprises discontinuous oxide that forms a framework of oxide, and the step of aligning comprises matching the framework of each oxide layer.

15. The method of claim 12, further comprising the steps of, after the applying step:
    reducing the temperature and the voltage;
    annealing the first wafer, the second wafer, and the at least another wafer.

16. The method of claim 12, wherein the first wafer and the third wafer are silicon-on-insulator wafers.

17. The method of claim 12, wherein the first wafer and the second wafer are glass wafers, and the third wafer is a silicon layer.

18. A method comprising the steps of:
    hydrolyzing at least one surface on at least one of a plurality of wafers;
    elevating the plurality of wafers to a fusion bonding temperature; and
    applying a voltage between at least one electrical contact on at least one surface of a first wafer of the plurality of wafers and at least one electrical contact on at least one surface of a second wafer of the plurality of wafers.

* * * * *